US012266904B2

(12) United States Patent
Shahin et al.

(10) Patent No.: US 12,266,904 B2
(45) Date of Patent: Apr. 1, 2025

(54) MODULATOR INTEGRATION FOR LASER USED WITH DISPLAY

(71) Applicant: Microsoft Technology Licensing, LLC, Redmond, WA (US)

(72) Inventors: Shiva Shahin, Seattle, WA (US); Dale Eugene Zimmerman, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 918 days.

(21) Appl. No.: 17/337,312

(22) Filed: Jun. 2, 2021

(65) Prior Publication Data

US 2022/0393426 A1    Dec. 8, 2022

(51) Int. Cl.
*H01S 5/042* (2006.01)
*G02B 26/08* (2006.01)
*G02B 27/01* (2006.01)
*H01S 5/026* (2006.01)
*H01S 5/12* (2021.01)

(52) U.S. Cl.
CPC ........ *H01S 5/0427* (2013.01); *G02B 26/0833* (2013.01); *H01S 5/0265* (2013.01); *H01S 5/12* (2013.01); *G02B 27/0172* (2013.01)

(58) Field of Classification Search
CPC ..................................................... H01S 5/0427
See application file for complete search history.

(56) References Cited

U.S. PATENT DOCUMENTS

| 6,526,083 B1* | 2/2003 | Kneissl ................. H01S 5/0265 372/50.22 |
| 2018/0287333 A1 | 10/2018 | Ooi et al. |
| 2020/0274324 A1* | 8/2020 | Dykaar ................. H01S 5/1234 |
| 2020/0373734 A1 | 11/2020 | Shahin et al. |

OTHER PUBLICATIONS

"International Search Report and Written Opinion Issued in PCT Application No. PCT/US22/027971", Mailed Date: Sep. 5, 2022, 11 Pages.

* cited by examiner

Primary Examiner — Tuan N Nguyen
(74) Attorney, Agent, or Firm — Alleman Hall & Tuttle LLP

(57) ABSTRACT

A laser device for use with a display including a plurality of pixels is disclosed. The laser device includes a gain section and a modulator. The gain section is electrically coupled with a first current or voltage source. The gain section is configured to selectively amplify an optical power of light reflecting within the gain section based on a first drive current or voltage supplied from the first current or voltage source to the gain section. The modulator is optically coupled with the gain section. The modulator is electrically coupled with a second current or voltage source. The modulator is configured to selectively attenuate or amplify an optical power of light received from the gain section based on a second drive current or voltage supplied from the second current or voltage source to the modulator. Light emitted from the modulator is provided to the display.

15 Claims, 8 Drawing Sheets

MODULATOR INTEGRATION FOR LASER USED WITH DISPLAY

BACKGROUND

Displays using laser scanning micro-electro-mechanical systems (MEMS) have several advantages over liquid crystal displays (LCDs) and liquid crystal on silicon (LCOS) displays. Such advantages include smaller size, lighter weight, lower power consumption, and higher brightness and contrast. A laser scanning MEMS display may include a laser light source and a mirror array, which are controlled in conjunction to progressively scan a set of pixels. In particular, the mirror array may be adjusted to direct laser light at different pixel locations for a user's eye to view. Individual pixels may be scanned in such a rapid manner that the entirety of a resulting image appears before the user's eye without the user realizing that the image is progressively scanned pixel by pixel and line by line. In this way, the MEMS laser scanning display may project or render image content for a user to view.

SUMMARY

A laser device for use with a display including a plurality of pixels is disclosed. The laser device includes a gain section and a modulator. The gain section is electrically coupled with a first current or voltage source. The gain section is configured to selectively amplify an optical power of light reflecting within the gain section based on a first drive current or voltage supplied from the first current or voltage source to the gain section. The modulator is optically coupled with the gain section. The modulator is electrically coupled with a second current or voltage source. The modulator is configured to selectively attenuate or amplify an optical power of light received from the gain section based on a second drive current or voltage supplied from the second current or voltage source to the modulator. Light emitted from the modulator is provided to the display.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
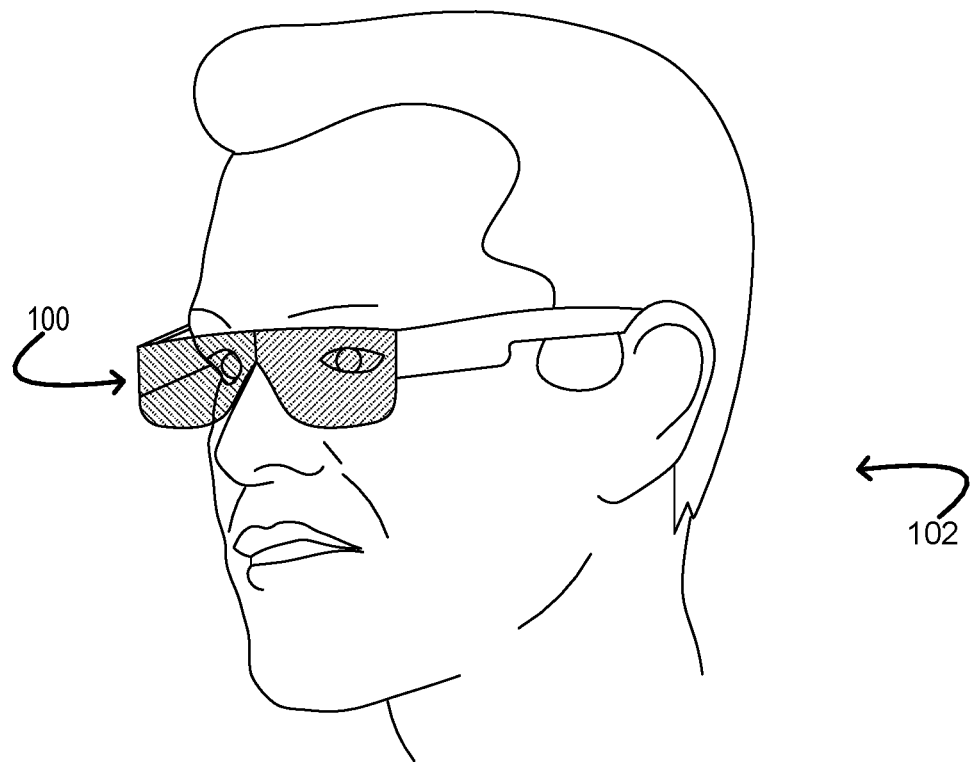
FIG. 1 shows an example near-eye display device.

In a laser scanning micro-electro-mechanical systems (MEMS) based display system, an optical power (i.e., brightness or luminance) of each pixel in the display is adjusted by controlling a laser injection current of a laser device. Ideally, the optical power of the laser device would have a linear response to the laser injection current across an entire operating range of the laser device. In this way, any desired optical power could be accurately generated for a pixel by adjusting the laser injection current to a corresponding laser injection current level.

However, the optical power response to the laser injection current for an actual laser device changes across the operating range of the laser device. In particular, an optical power response current curve includes a threshold current. Above the threshold current, optical power rises linearly relative to laser injection current. Below the threshold current, minimal stimulated light is emitted by the laser device. The position of the threshold current in the optical power response current curve may shift based on changes in operating conditions (e.g., temperature) of the laser device. Accordingly, when a typical laser device is controlled with a laser injection current in an operating region near the threshold current, the laser device may produce an actual optical power that differs from a target optical power due to a shift in the position of the threshold current. Such a shift in the position of the threshold current causes a laser control error that results in reduced brightness accuracy in pixels in a displayed image. As such, the displayed image may have a perceived reduction in image quality.

Another issue that contributes to laser control errors is the accessible dynamic range (DR) of a laser device. Due to a limitation on maximum power that is obtainable from a laser device and the difficulty of optical power control in the lower power range as discussed above, a DR of a laser device is limited. Such a limited DR of the laser device results in a tight requirement on a step size of the laser injection current across the DR. For example, a step size (e.g., 25 µA) may be much smaller than a current shift of the threshold current (e.g., a few mA). This disparity contributes to laser control errors in the operating region around the threshold current.

Accordingly, to address these and other issues, the present description is directed to a laser device for use in a display as well as other laser-based applications. The laser device includes a modulator integrated with a gain section of the laser device. By integrating the modulator with the gain section, the modulator can be controlled in conjunction with the gain section to precisely control pixel brightness in a display system with which the laser device is used as a light source. For example, when a target optical power for a pixel is in/around an operating region of the threshold current of the gain section, the gain section may be controlled to produce a preliminary optical power that is greater than the target optical power so that operation of the gain section moves away from the problematic operating region. Further, the modulator may be controlled to attenuate or amplify the preliminary optical power of light passing through the modulator down to the target optical power. In this way, the laser device may be controlled to provide accurate pixel brightness in/around the operating region of the threshold current.

FIG. 1 illustrates an example near-eye display device 100 that employs a laser device having an integrated modulator. As illustrated herein, the near-eye display device 100 is worn and operated by a user 102. The near-eye display device 100 is configured to present virtual imagery in the user's field of view. In some implementations, user-input componentry of the near-eye display device 100 may enable the user to interact with the virtual imagery. The near-eye display device 100 takes the form of eyeglasses in the example of FIG. 1. In other examples, the near-eye display device 100 may take the form of goggles, a helmet, or a visor. In still other examples, the near-eye display device 100 may be a component of a non-wearable electronic device, such as a heads-up display. Indeed, the present discussion is applicable to any laser-based display where imprecise brightness control is potentially an issue.

The near-eye display device 100 may be configured to cover one or both eyes of the user 102 and may be adapted for monocular or binocular image display. In examples in which the near-eye display device 100 covers only one eye, but binocular image display is desired, a complementary near-eye display device may be arranged over the other eye. In examples in which the near-eye display device covers both eyes and binocular image display is desired, the virtual imagery presented by the near-eye display device 100 may be divided into right and left portions directed to the right and left eyes, respectively. In scenarios in which stereoscopic image display is desired, the virtual imagery from the right and left portions, or complementary near-eye display devices, may be configured with appropriate stereo disparity to present a three-dimensional subject or scene.

Figure 2:
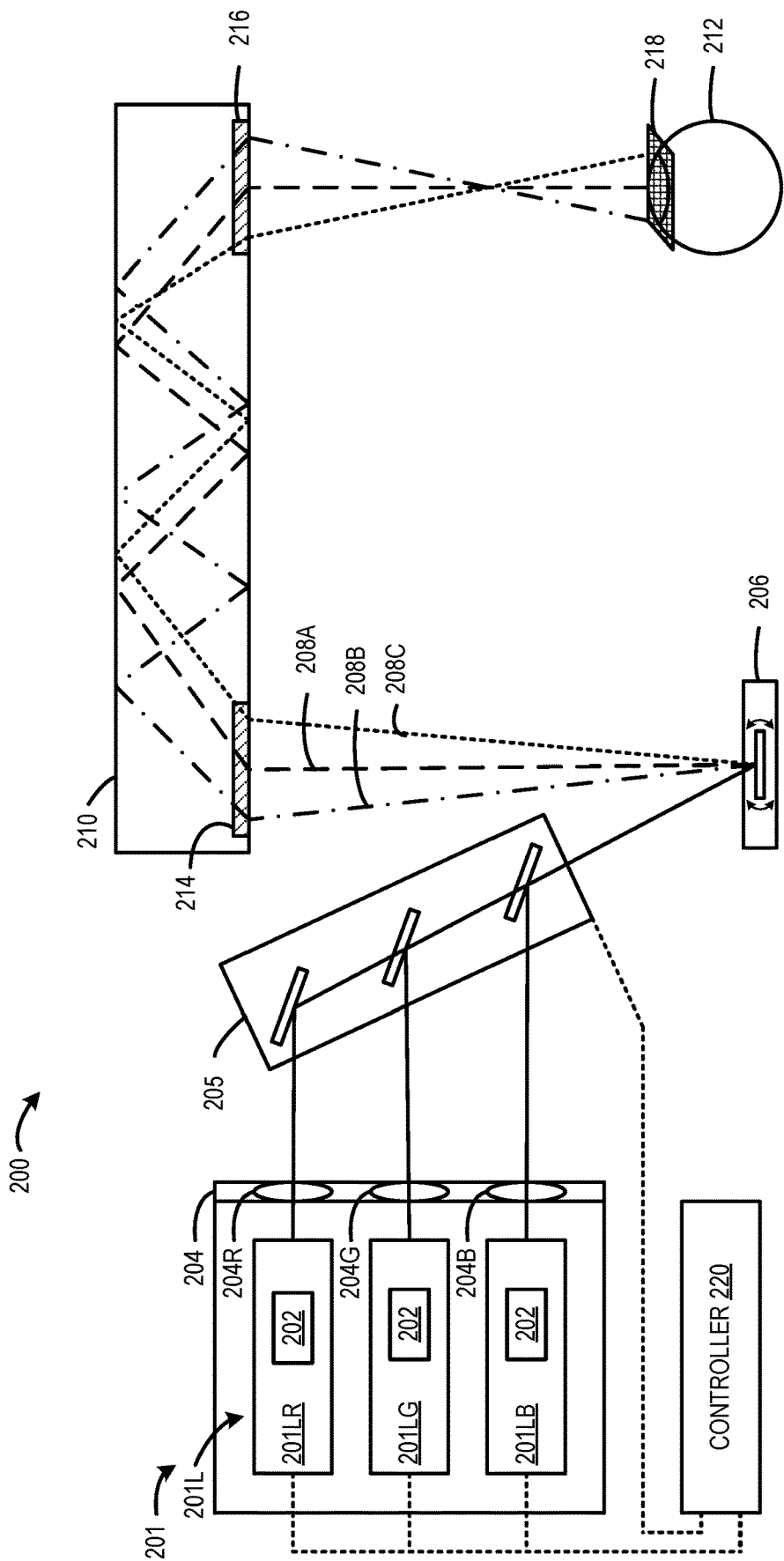
FIG. 2 shows an example micro-electro-mechanical systems (MEMS) laser scanning display of the near-eye display device of FIG. 1.

FIG. 2 shows an example micro-electro-mechanical system (MEMS) laser scanning display 200 that may be incorporated into the near-eye display device 100 of FIG. 1, or other near-eye display devices. The MEMS laser scanning display 200 uses a laser assembly 201. The laser assembly 201 comprises a plurality of laser light sources 201L which may each emit an associated color of light. For example, red laser light source 201LR emits red light, green laser light source 201LG emits green light, and blue laser light source 201LB emits blue light. Although only three laser light sources 201L are shown, it will be appreciated that the laser assembly 201 may include any suitable number of laser light sources 201L. For example, the laser assembly 201 may include 0, 1, 2, 3, or more than 3 red laser light sources 201LR; 0, 1, 2, 3, or more than 3 green laser lights sources 201LG; 0, 1, 2, 3, or more than 3 blue laser light sources 201LB.

The laser light sources 201L may each be comprised of one or more laser diode emitters 202. For example, each laser light source 201L may include 1, 2, 3, or more than 3 laser diode emitters of a suitable color. Any combination or modification in the number of laser diode emitters may also be available (e.g., 2 red, 2 green, 2 blue, or 1 red, 1 green, 2 blue, etc.). Accordingly, any suitable number of laser light sources may be used to irradiate/illuminate pixels for generating image content. Further, each laser light source may have a suitable number of laser diode emitters 202, which may be singular or arranged in an array for example.

In some, though not all, configurations, the laser assembly 201 also includes a collimating lens assembly 204 (or other diffractive optical element) that is structured to direct light to another location or otherwise operate on the light in some manner. In this example, each of the laser light sources 201LR, 201LG, and 201LB has a corresponding collimating lens 204, individually labeled 204R, 204G, 204B. In some implementations, however, a single collimating lens may be used for more than one laser light source.

The MEMS laser scanning display 200 includes combination optics 205 configured to spatially combine the light beams lased from the plurality of laser light sources 201LR, 201LG, and 201LB into a single light beam.

The MEMS laser scanning display 200 includes a MEMS mirror system 206. The MEMS mirror system 206 is configured to collect laser light from the combination optics 205, which combines light lased from three different sources (i.e., the laser light sources 201LR, 201LG, and 201LB) into a single light beam, in this example. Additionally, the MEMS mirror system 206 is configured to direct laser light 208A (which, in this example includes red laser light, green laser light, and blue laser light) to a waveguide 210. Furthermore, the MEMS mirror system 206 is configured to redirect its mirrors/mirror array so that the laser light 208A is aimed at different locations at the waveguide 210. As shown, laser lights 208B and 208C are aimed at different locations on the waveguide 210. In this manner, the MEMS mirror system 206 is able to route light to different locations by adjusting the aim of its corresponding mirror array. It will be appreciated that the laser lights 208A-C may be modulated to include varying degrees or intensities (or even an absence of any one or more) of red, green, blue, or other color, laser light.

The waveguide 210 is configured to redirect or propagate the laser light 208A-C to a desired location which is viewable by a user's eye 212. It will be appreciated that waveguide 210 may be any type of waveguide display (e.g., a surface relief grating waveguide).

The laser light 208A-C enters the waveguide 210 via an entry grating 214. The laser light 208A-C then propagates (e.g., via total internal reflection) through the waveguide 210 until it reaches an exit grating 216. It will be appreciated that the angles with which the laser light 208A-C enters the waveguide 210 are preserved as the laser light 208A-C propagates through the waveguide 210. This condition is shown by the different angles that each of the respective laser lights 208A-C propagate through the waveguide 210. By configuring the entry grating 214 and the exit grating 216 to meet certain design parameters, the MEMS mirror system 206 is able to use waveguide 210 to propagate light towards the user's eye 212.

The laser assembly 201 and the MEMS mirror system 206 may be controlled by a controller 220. The controller 220 may be configured to control the MEMS mirror system 206, in conjunction with the laser assembly 201 to progressively scan a set of pixels 218. In particular, the controller 220 may be configured to adjust the mirror array so that the combined RGB laser beam or light is aimed at different locations for a user's eye 212 to view. Individual pixels of the set of pixels 218 may be scanned in such a rapid manner that the entirety of a resulting image appears before the user's eye 212 without the user realizing that the image was progressively scanned pixel by pixel and line by line. In this way, the MEMS laser scanning display 200 may project or render image content for a user to view.

The MEMS mirror system 206 may be able to scan an image (i.e., pixels of that image) at any image resolution or range of image resolutions (e.g., in cases where foveated rendering is used). For example, in some implementations, the MEMS mirror system 206 is configured to scan RGB light from the laser assembly 201 with a resolution of 2,000 pixels by 1,200 pixels, or any other resolution.

Note that the principles disclosed herein are applicable to any type of laser-based display unit and not only to architectures with the MEMS mirror system 206.

Figure 3:
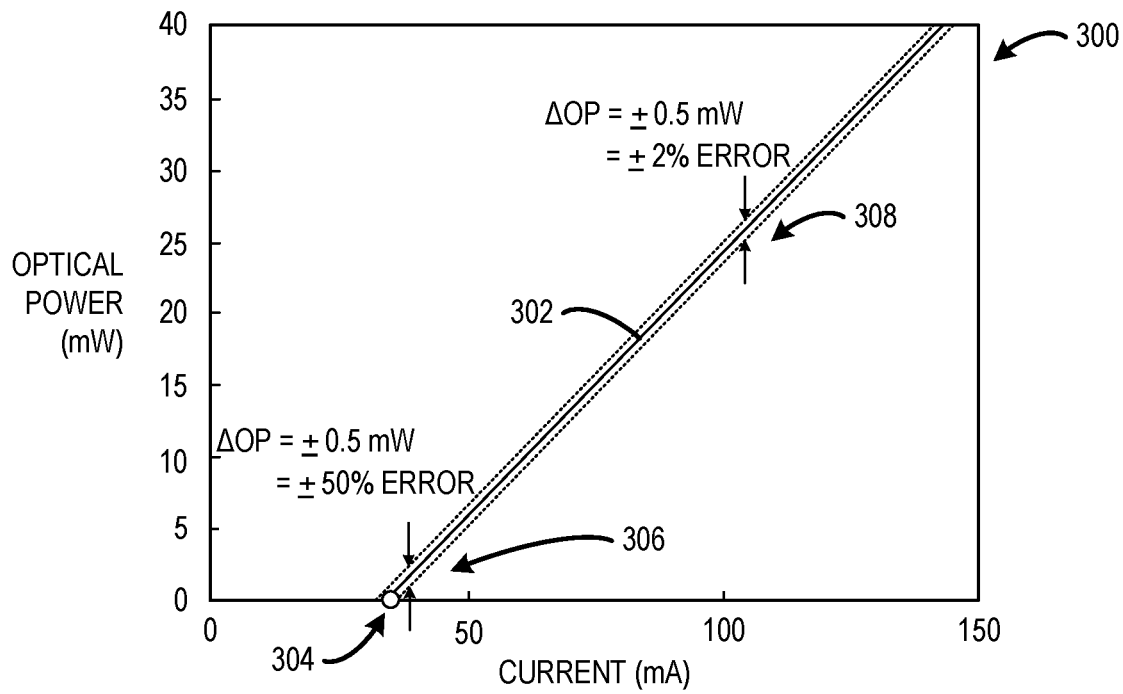
FIG. 3 shows a graph plotting laser optical power response to laser injection current for a laser without an integrated modulator.

FIG. 3 shows a graph 300 plotting an example optical power response curve 302 based on a laser injection current for a laser device without an integrated modulator. The optical power response curve 302 includes a threshold current 304. Above the threshold current 304, optical power rises linearly relative to the laser injection current. Below the threshold current 304, minimal stimulated light is emitted by the laser device. The position of the threshold current 304 in the optical power response current curve 302 may shift based on changes in operating conditions of the laser device. For example, the threshold current 304 may be sensitive to shifts in temperature, such as from laser self-heating and adjacent emitter heating. Such shifts in temperature result in a shift of the threshold current 304. In fact, the entire response curve 302 shifts with temperature. However, due to the lower optical power values at/around the threshold current 302, the shift in position of the threshold current 302 results in a larger error percentage.

In the illustrated example, the threshold current 304 is positioned at ~40 mA. In an operating region 306 at/around the threshold current 304, a shift in the response curve 302 of ±0.5 mW produces a ±50% error between the target optical power and the actually optical power, because the optical power level is lower near the threshold. Such an error may be perceivable in a pixel of a display. On the other hand, in an operating region 308 away from the threshold current 304, a same shift in the response curve 302 of ±0.5 mW produces a ±2% error between the target optical power and the actually optical power. The ±2% error at the higher optical power level may be within acceptable operating margins for a pixel of a display.

Figure 4:
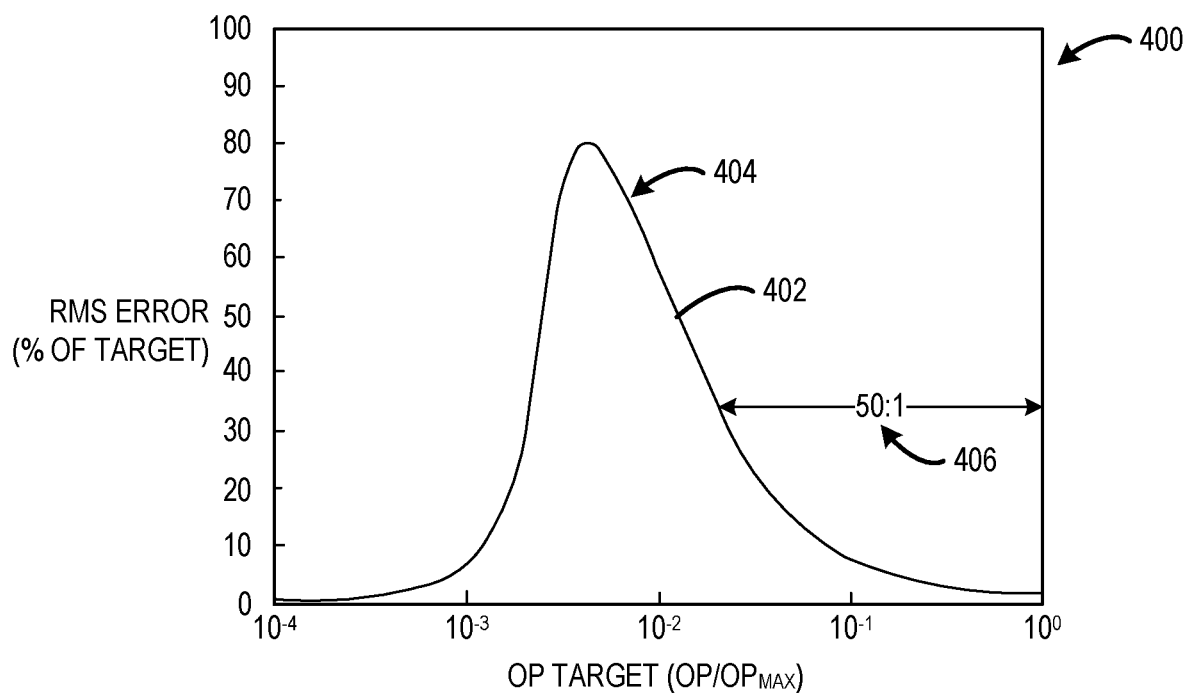
FIG. 4 shows a graph plotting root-mean square RMS error versus a target optical power for a laser without an integrated modulator.

FIG. 4 shows a graph 400 depicting a root-mean-square (RMS) error curve 402 across a target optical power range for a laser device without an integrated modulator. The RMS error curve includes a "knee" error region 404 where the error level is greater than ~30% due to shifting of the threshold current 304 in graph 300 shown in FIG. 3. The error region 404 effectively limits the usable DR 406 of the laser without the integrated modulator to ~50:1. As discussed above, such a limited DR of the laser device results in a tight requirement on a step size of the laser injection current across the DR that contributes to laser control errors in the operating region around the threshold current of the laser device without the integrated modulator.

Figure 5:
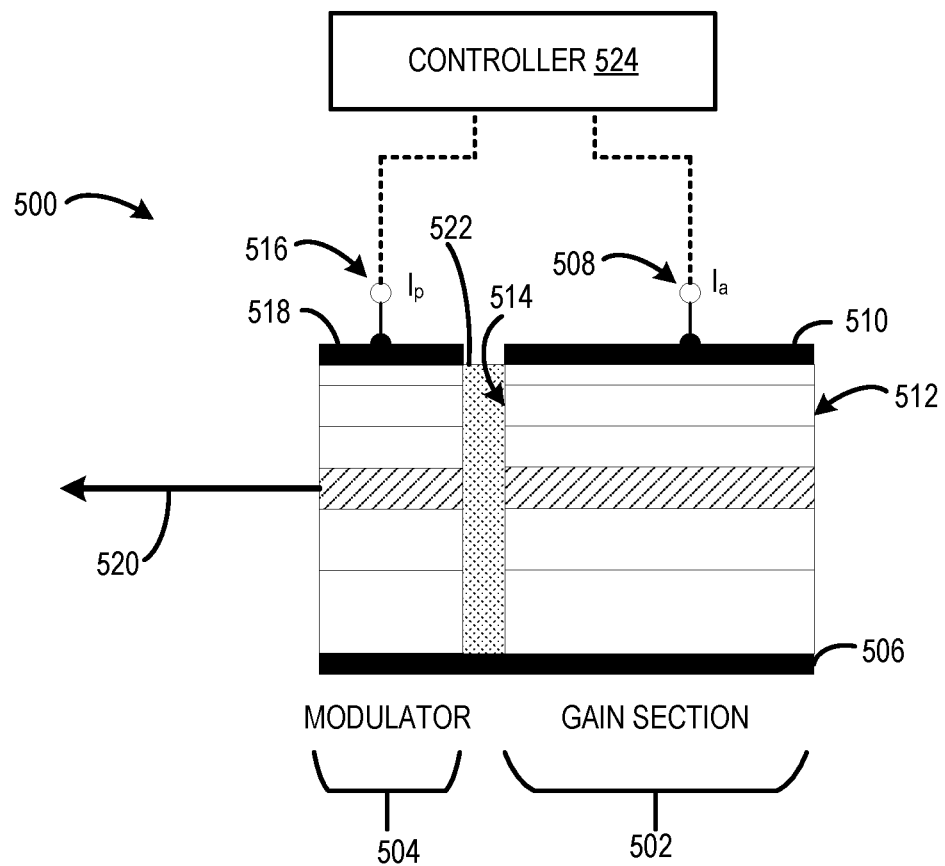
FIG. 5 shows an example implementation of a laser device with an integrated modulator.

A laser device that is used as a light source for a display may integrate a modulator that can be controlled in conjunction with the laser device to increase control precision of optical power for a pixel in a display and extend an effective dynamic range of the laser device. FIG. 5 shows an example implementation of a laser device 500 including a gain section 502 and an integrated modulator 504. The laser device 500 may be representative of any suitable type of laser. For example, the laser device 500 may be representative of any of the laser diode emitters 202 of any of the laser light sources including 201LR, 201LG, and 201LB in the MEMS laser scanning display 200 shown in FIG. 2 or any other suitable laser device.

The laser device 500 includes a substrate 506. Various epitaxial layers of the laser device 500 may be directly or indirectly deposited on top of the substrate 506. In the illustrated example, the epitaxial layers used to form the gain section 502 are extended to also form the modulator 504 on the substrate 506. In other words, the gain section 502, and the modulator 504 are fabricated as the same epitaxial layer(s) on the monolithic substrate 506. In other examples, the modulator 504 can be fabricated using a regrowth technique, where the epitaxial layers used in the modulator can be grown to be different than that of the gain section 502.

In some implementations, the gain section 502, and the modulator 504 may be optically coupled via heterogeneous integration. For example, the gain section 502 and the modulator 504 may be optically coupled via edge coupling, grating coupling, using Ball lenses, and/or using another heterogeneous integration approach.

The gain section 502 is the source of optical gain within the laser device 500 and is configured to amplify an optical power of light reflecting within the gain section 502. The gain/amplification results from the stimulated emission of electronic or molecular transitions of an active gain medium of the gain section 502 to a lower energy state from a higher energy state previously populated by a pump source. To this end, the gain section 502 is electrically coupled with a first current or voltage source 508 via a first electrode 510. In some examples, the first current or voltage source 508 is a current source. In other examples, the first current or voltage source 508 is a voltage source. The first current or voltage source 508 may be configured to supply a first drive current or voltage source to the gain section 502. The gain section 502 may be configured to selectively amplify an optical power of light reflecting within the gain section 502 based on a first drive current or voltage. The gain section 502 may be configured to emit light from the gain section into the modulator 504.

The gain section 502 includes a reflective end 512 and a selectively reflective end 514. The two reflective ends 512 and 514 may allow coherent light to reflect back and forth within the gain section 502. Each time a light beam passes through the gain section 502, the optical power of the light beam may be amplified. The selectively reflective end 514 may be partially transparent to allow coherent light to be output from the gain section 502 and into the modulator 504.

The modulator 504 is configured to selectively absorb or amplify light that passes through the modulator 504 to precisely control an optical power of light emitted from the laser device 500. The modulator 504 is optically coupled with the gain section 502. The modulator 504 is electrically coupled with a second current or voltage source 516 via a second electrode 518. In some examples, the second current or voltage source 516 is a current source. In other examples, the second current or voltage source 516 is a voltage source. The second current or voltage source 516 may be configured to supply a first drive current or voltage source to the modulator 504. The modulator 504 is configured to selectively attenuate or amplify an optical power of light received from the gain section 502 based on a second drive current or voltage supplied from the second current or voltage source 516 to the modulator 504. In particular, the second drive current or voltage may electrically modify an absorption coefficient of material of the modulator 504 to change electrical absorption or amplification properties of the modulator 504. The modulator 504 may be controlled to attenuate or amplify optical power of the gain section 502 depending on the desired pixel brightness of the display and the operating characteristics of the laser device (e.g., the operating conditions where the "knee" error region occurs). In some examples, the modulator 504 is controlled to attenuate the optical power received from the gain section 502 based on the second drive current or voltage. In other examples, the modulator 504 is controlled to amplify the optical power received from the gain section 502 based on the second drive current or voltage. Light 520 emitted from the modulator 504 (and correspondingly the laser device 500) may be provided to a display, such as the MEMS laser-scanning display system 200 shown in FIG. 2.

At least a portion of the gain section 502 may be electrically isolated from at least a portion of the modulator 504. For example, the first electrode 512 may be separated from the second electrode 518, such that drive currents or voltages supplied by the current or voltage sources 508, 516 may be injected into the respective portions of the gain section 502 and the modulator 504 that lie underneath the first and second electrodes 510, 518, respectively without interfering with operation of the other portions. Such electrical isolation may allow for independent operation/control of the gain section 502 and the modulator 504 to precisely control an optical power of light emitted from the laser device 500.

In some implementations, the gain section 502, and the modulator 504 may be optically coupled via a bridging component 522. The bridging component 522 may remove the need for use of heterogenous integration platforms for optical coupling which may be bulkier and more lossy relative to optical coupling via the bridging component 522.

In some examples, the bridging component 522 may be act as a laser facet mirror that provides a designated optical power reflectivity into the gain section 502. In one example, the designated power reflectivity may range from 10% for red lasers to more than 50% for blue and green lasers. The optical power outside of these ranges may be transmitted to the modulator 504 with minimal coupling loss (e.g., less than 3 dB loss) or no coupling loss.

In some examples, the bridging component 522 may be configured to spectrally filter the optical power and contribute to the overall spectral bandwidth. In other examples, the bridging component 522 may be configured to have a broad enough spectral bandwidth such that the overall spectrum of light emitted from the laser device 500 is determined mainly by the spectrum of the gain section 502.

Figure 6:
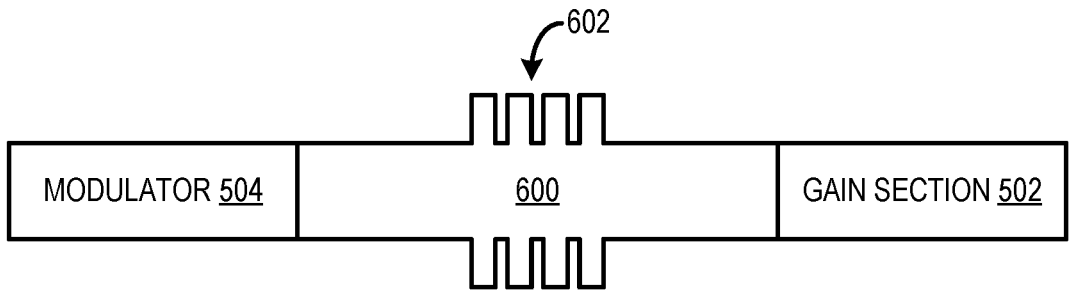
FIGS. 6-8 show different example implementations of a bridge component.
Figure 7:
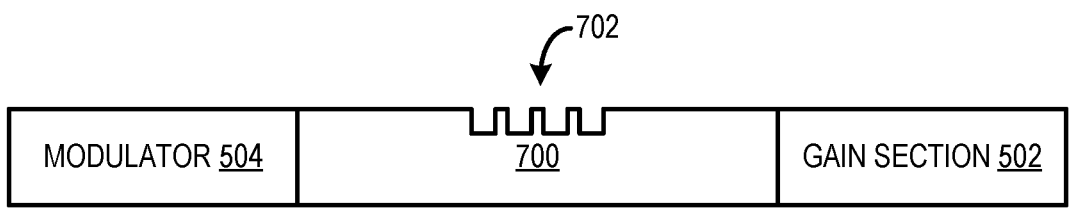
Figure 8:
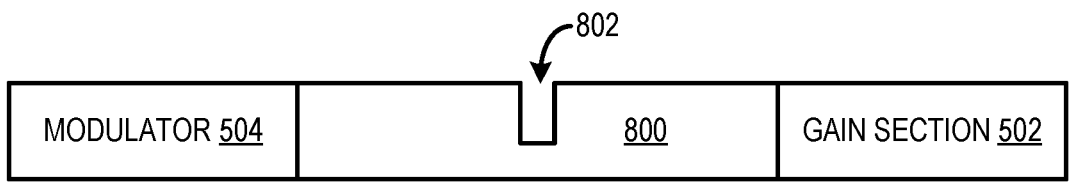

The bridging component 522 may take any suitable form. FIGS. 6-8 show different example implementations of bridging components that may be used to optically couple the gain section 502 and the modulator 504. FIGS. 6-7 show example bridging components that dictate, to at least some degree, the spectrum of light emitted by the laser device 500.

In FIG. 6, a bridging component 600 comprises a Bragg grating 602 distributed along sidewalls of the bridging component 600. The bridging component 600 may embody the bridging component 522 shown in FIG. 5. Note that FIG. 6 shows a top view of the bridging component 600 to highlight the Bragg grating 602 extending out from the sidewalls of the bridging component 600. The Bragg grating 602 can be designed for a specified power reflection into the gain section 502 and transmission into the modulator 504. In some examples, the Bragg grating 602 may be configured as distributed Bragg reflectors (DBRs) that are configured to narrow down the bandwidth of light transmitted to the modulator 504.

In FIG. 7, a bridging component 700 comprises a Bragg grating 702 distributed along a top cladding layer of the bridging component 700. The bridging component 700 may embody the bridging component 522 shown in FIG. 5. Note that FIG. 7 shows a side view of the bridging component 700 to highlight the Bragg grating 702 etched in the top cladding layer of the bridging component 700. The Bragg grating 702 can be designed for a specified power reflection into the gain section 502 and transmission into the modulator 504. In some examples, the Bragg grating 702 may be configured as distributed Bragg reflectors (DBRs) that are configured to narrow down the bandwidth of light transmitted to the modulator 504.

FIG. 8 shows an example bridging component that may be used in a configuration where the spectrum of light emitted by the laser device 500 is dictated by the active gain section 502. In FIG. 8, a bridging component 800 comprises a notch 802. The bridging component 800 may embody the bridging component 522 shown in FIG. 5. The notch 802 may be designed to have a designated optical power reflection into the gain section 502 and transmission into the modulator 504. Further, the notch 802 may be configured to have a broad spectral bandwidth. The notch 802 may be less complex to fabricate than the Bragg gratings used in the bridging components 600 and 700. Further, the notch 802 may introduce less optical power loss than the Bragg gratings used in the bridging components 600 and 700.

Returning to FIG. 5, a controller 524 may be electrically connected to the first electrode 510 and the second electrode 518. In some examples, the controller 524 may be representative of the controller 220 shown in FIG. 2. In other examples, the controller 524 may be a separate controller that is designated to individually control the laser device 500. The controller 524 may include or act as a current source and/or a voltage source to provide drive currents/voltages to the first and second electrodes 510, 518 separately and independently. In other words, the controller 524 may act as both the first current or voltage source 508 and the second current or voltage source 516.

The controller 524 may be configured to modulate, via the first current or voltage source 508, the first drive current or voltage and to modulate, via the second current or voltage source 516, the second drive current or voltage to dynamically adjust an optical power of light emitted from the laser device 500 to a target optical power. The controller 524 may be configured to perform such dynamic modulation at least on a per pixel basis for the plurality of pixels of the display to precisely control pixel brightness to form a displayed image. Depending on the target optical power/pixel brightness, the controller 524 may be configured to controller the gain section 502 with or without influence of the modulator 504. The controller 524 may be configured to employ any suitable control scheme to control the gain section 502 and the modulator 504 in conjunction to precisely control the optical power of light emitted from the laser device 500.

Figure 9:
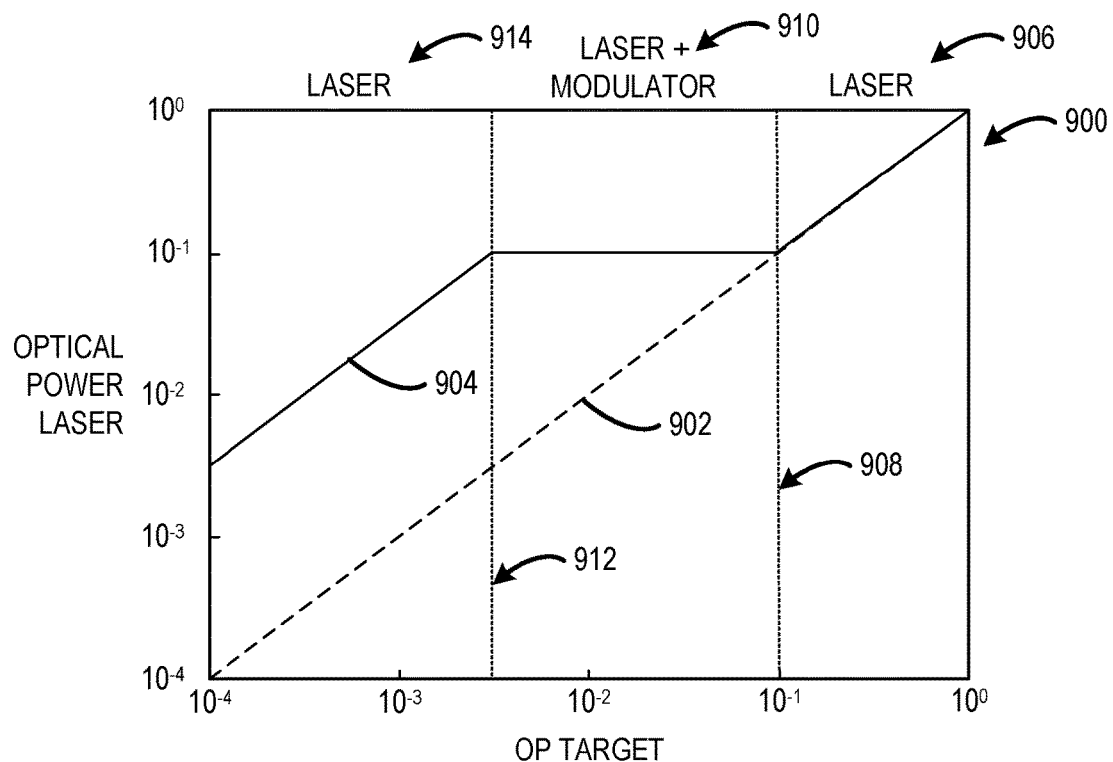
FIG. 9 shows an example control scheme for the laser device shown in FIG. 5.

FIG. 9 shows a graph 900 depicting an example control scheme that may be employed by the controller 524 shown in FIG. 5. The graph 900 plots a target optical power versus a laser optical power emitted from the laser device 500. In the graph 900, the laser device optical power (i.e., the gain section and the modulator) 902 is indicated as a dashed line and the gain section optical power 904 is indicated by a solid line.

According to the depicted control scheme, in a first operating region 906 where the target optical power is greater than a first threshold optical power 908, the controller 524 may be configured to modulate the gain section with a first drive current or voltage such that the gain section amplifies the optical power of light in the gain section to the target optical power. Further, the controller 524 may be configured to modulate the modulator with a second current or voltage such that the modulator minimally or does not attenuate the optical power of light passing through the modulator. In other words, the modulator may be substantially transmissive to light passing through the modulator, such that the gain section alone effectively provides the target optical power.

In a second operating region 910, where the target optical power is less than the first threshold optical power 908 and greater than a second optical power threshold 912, the controller 524 may be configured to use the modulator in conjunction with the gain section to provide the target optical power. The upper threshold optical powers 908 and the lower threshold optical power 912 may define a "knee" error region where the error level of the laser device may degrade image quality due to threshold current uncertainty. In the second operating region, the controller 524 is configured to modulate the gain section with a first drive current or voltage such that the gain section amplifies the optical power of light in the gain section to a preliminary optical power that is greater than the target optical power. The preliminary optical power may be provided by a drive current or voltage that is suitably high enough to stay away from the threshold current even as the threshold current shifts due to varying operating conditions (e.g., changes in temperature). Further, the controller 524 is configured to modulate the modulator with a second drive current or voltage such that the modulator attenuates or amplifies the preliminary optical power of light passing through the modulator to the target optical power. In this way, the laser device 500 may provide precise control of the optical power regardless of threshold current uncertainty.

In a third operating region 914, where the target optical power is less than the second threshold optical power 908, the controller 524 may be configured to modulate the gain section with a first drive current or voltage such that the gain section amplifies the optical power of light in the gain section to the target optical power. Further, the controller 524 may be configured to modulate the modulator with a second current or voltage such that the modulator minimally or does not attenuate the optical power of light passing through the modulator. In other words, the modulator may be substantially transmissive to light passing through the modulator, such that the gain section alone effectively provides the target optical power.

The graph 900 depicts one example control scheme that may be employed by the controller 524 to control the gain section 502 and the modulator 504 to precisely control the optical power of light emitted from the laser device 500 across an operating range of the laser device 500. The controller 524 may be configured to employ any suitable control scheme to control the gain section 502 and the modulator 504 to precisely control the optical power of light emitted from the laser device 500.

Figure 10:
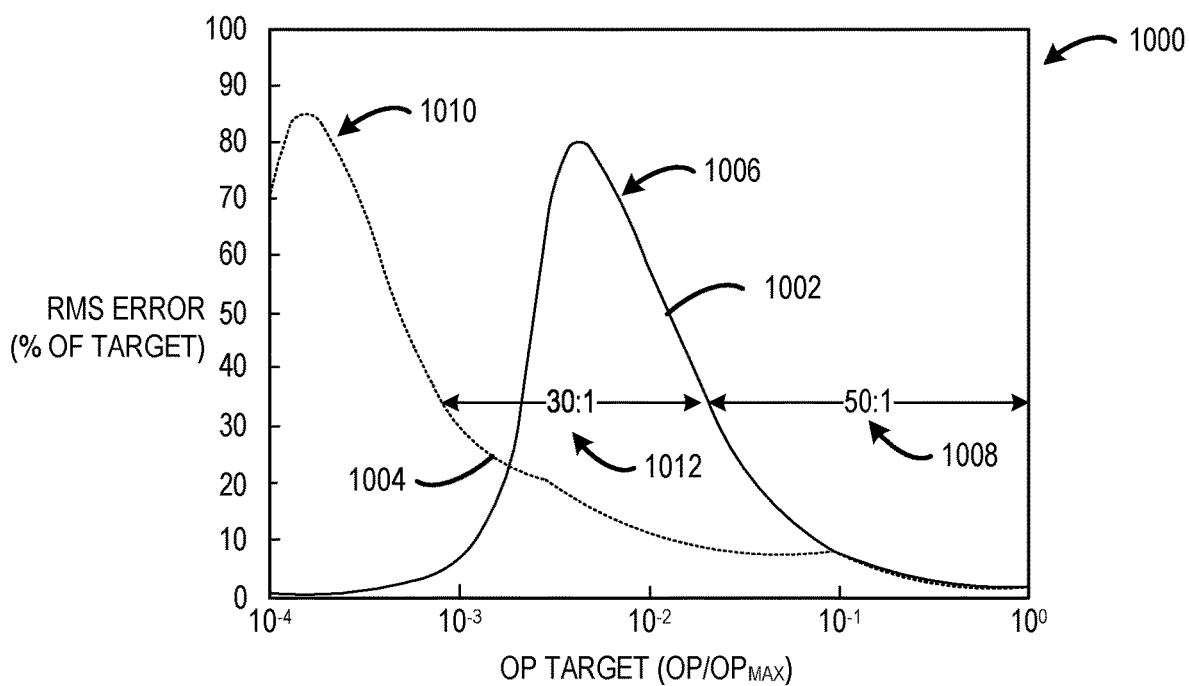
FIG. 10 shows a graph plotting laser RMS error versus a target optical power for a laser with an integrated modulator.

FIG. 10 shows a graph 1000 depicting an RMS error curve 1002 across a target optical power range for a laser device without an integrated modulator. The graph 1000 further depicts an RMS error curve 1004 across a target optical power range for a laser device including an integrated modulator, such as the laser device 500 shown in FIG. 5. The RMS error curve 1002 includes a "knee" error region 1006 that effectively limits the usable DR 1008 of the laser without the integrated modulator to ~50:1. In the RMS error curve 1004, the "knee" error region 1010 is shifted to a much smaller power resulting in a 30X increase in the accessible DR 1012 relative to the laser device without an integrated modulator. In other words, the laser device including the integrated modulator may have an effective DR 1012 of ~1500:1. Such an increase in DR may allow for more precise control of the optical power of light provided from the laser device to a display.

Figure 11:
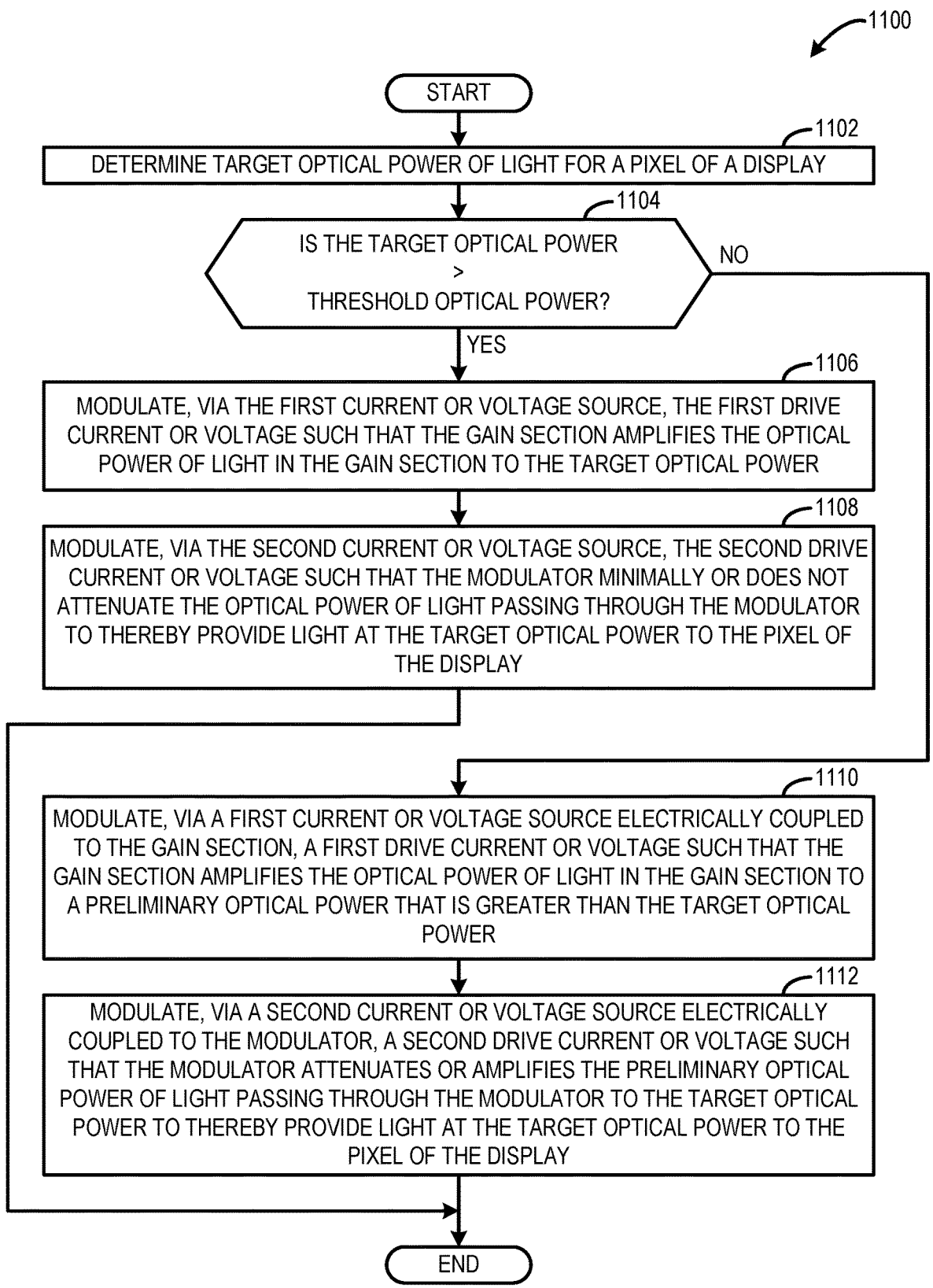
FIG. 11 is a flowchart of an example method for operating a laser device including an integrated modulator.

FIG. 11 shows an example method 1100 for a laser device as a laser light source for a display including a plurality of pixels. The laser device may include a gain section and a modulator. For example, the method 1100 may be performed by the controller 220 to operate any of the laser diode emitters 202 of the MEMS laser scanning display 200 shown in FIG. 2, the controller 524 to operate the laser device 500 shown in FIG. 5, or generally any other suitable laser device.

At 1102, the method 1100 includes determining a target optical power of light for a pixel of the display. The target optical power may correspond to a brightness or intensity of a pixel of a display, such as the MEMS laser scanning display 200 shown in FIG. 2.

At 1104, the method 1100 includes determining whether the target optical power is greater than a threshold optical power. If the target optical power is greater than the threshold optical power, them the method 1100 moves to 1106. Otherwise, the method 1100 moves to 1110. The threshold optical power may be set to any suitable optical threshold value depending on where the "knee" error region of the laser device is located. Generally, the threshold optical power is set away from the knee error region of the laser device.

At 1106, the method 1100 includes modulating, via the first current or voltage source, the first drive current or voltage such that the gain section amplifies the optical power of light in the gain section to the target optical power.

At 1108, the method 1100 includes modulating, via the second current or voltage source, the second drive current or voltage such that the modulator minimally or does not attenuate the optical power of light passing through the modulator to thereby provide light at the target optical power to the pixel of the display. In the higher optical power operating region, the gain section effectively controls the optical power provided by the laser device without influence from the modulator.

At 1110, the method 1100 includes modulating, via a first current or voltage source electrically coupled to the gain section, a first drive current or voltage such that the gain section amplifies the optical power of light in the gain section to a preliminary optical power that is greater than the target optical power.

At 1112, the method 1100 includes modulating, via a second current or voltage source electrically coupled to the modulator, a second drive current or voltage such that the modulator attenuates or amplifies the preliminary optical power of light passing through the modulator to the target optical power to thereby provide light at the target optical power to the pixel of the display. In the lower optical power operating region, the gain section, and the modulator work in conjunction to effectively control the optical power provided by the laser device.

The above-described method may be performed at least on a per pixel basis for a plurality of pixels of the display to dynamically adjust the optical power of light emitted from the laser device to the target optical power at least on a per pixel basis for the plurality of pixels of the display. In this way, the laser device may precisely control the optical power without being susceptible to errors as a result of shifts in the threshold current.

In some implementations, the methods and processes described herein may be tied to a computing system of one or more computing devices. In particular, such methods and processes may be implemented as a computer-application program or service, an application-programming interface (API), a library, and/or other computer-program product.

Figure 12:
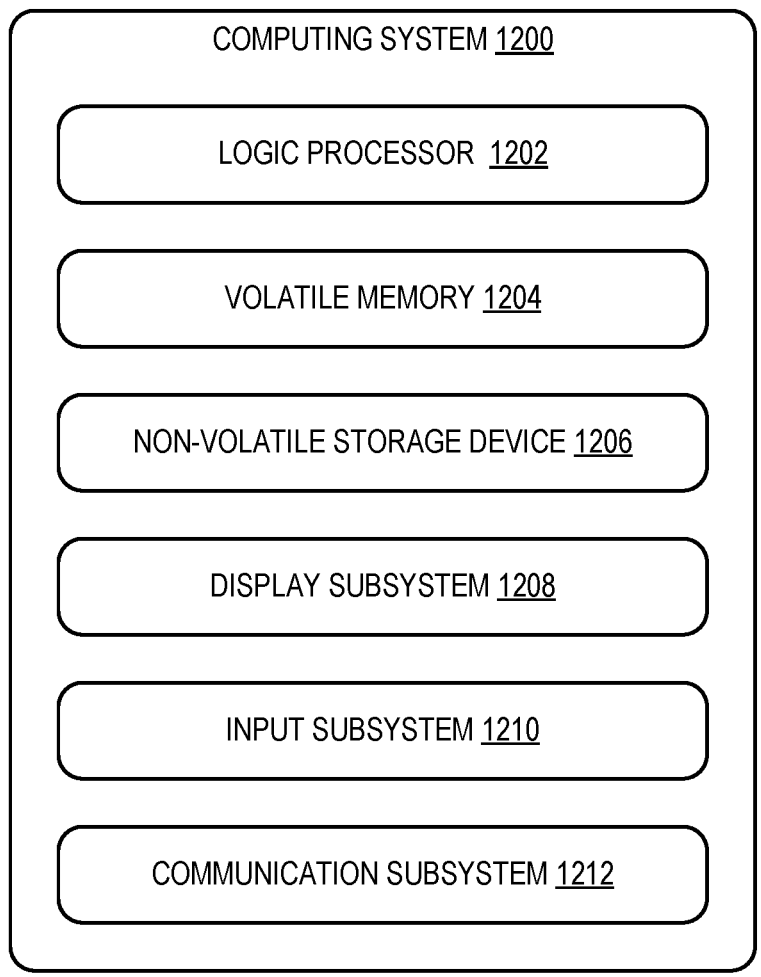
FIG. 12 schematically shows an example computing system.

FIG. 12 schematically shows a non-limiting implementation of a computing system 1200 that can enact one or more of the methods and processes described above. The computing system 1200 is shown in simplified form. For example, the computing system 1200 may embody the near-eye display system of FIG. 1, the MEMS laser scanning display 200 of FIG. 2, the controller 524 of FIG. 5, and/or any other suitable laser device described above. The computing system 1200 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices.

The computing system 1200 includes a logic processor 1202 volatile memory 1204, and a non-volatile storage device 1206. The computing system 1200 may optionally include a display subsystem 1208, input subsystem 1210, communication subsystem 1212, and/or other components not shown in FIG. 12.

Logic processor 1202 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 1202 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 1206 includes one or more physical devices configured to hold instructions executable by the logic processors to implement the methods and processes described herein. When such methods and processes are implemented, the state of non-volatile storage device 1206 may be transformed—e.g., to hold different data.

Non-volatile storage device 1206 may include physical devices that are removable and/or built in. Non-volatile storage device 1206 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1206 may include nonvolatile, dynamic, static, read/write, read-only, sequential-access, location-addressable, file-addressable, and/or content-addressable devices. It will be appreciated that non-volatile storage device 1206 is configured to hold instructions even when power is cut to the non-volatile storage device 1206.

Volatile memory 1204 may include physical devices that include random access memory. Volatile memory 1204 is typically utilized by logic processor 1202 to temporarily store information during processing of software instructions. It will be appreciated that volatile memory 1204 typically does not continue to store instructions when power is cut to the volatile memory 1204.

Aspects of logic processor 1202, volatile memory 1204, and non-volatile storage device 1206 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

When included, display subsystem 1208 may be used to present a visual representation of data held by non-volatile storage device 1206. The visual representation may take the form of a graphical user interface (GUI). As the herein described methods and processes change the data held by the non-volatile storage device, and thus transform the state of the non-volatile storage device, the state of display subsystem 1208 may likewise be transformed to visually represent changes in the underlying data. Display subsystem 1208 may include one or more display devices utilizing virtually any type of technology. Such display devices may be combined with logic processor 1202, volatile memory 1204, and/or non-volatile storage device 1206 in a shared enclosure, or such display devices may be peripheral display devices.

When included, input subsystem 1210 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 1212 may be configured to communicatively couple various computing devices described herein with each other, and with other devices. Communication subsystem 1212 may include wired and/or wireless communication devices compatible with one or more different communication protocols. As non-limiting examples, the communication subsystem may be configured for communication via a wireless telephone network, or a wired or wireless local- or wide-area network, such as a HDMI over Wi-Fi connection. In some embodiments, the communication subsystem may allow computing system 1200 to send and/or receive messages to and/or from other devices via a network such as the Internet.

In an example, a laser device for use with a display including a plurality of pixels comprises a gain section electrically coupled with a first current or voltage source and configured to selectively amplify an optical power of light reflecting within the gain section based on a first drive current or voltage supplied from the first current or voltage source to the gain section, and a modulator optically coupled with the gain section and electrically coupled with a second current or voltage source, the modulator configured to selectively attenuate or amplify an optical power of light received from the gain section based on a second drive current or voltage supplied from the second current or voltage source to the modulator, wherein light emitted from the modulator is provided to the display. In this example and/or other examples, the laser device may further comprise a controller configured to modulate, via the first current or voltage source, the first drive current or voltage and to modulate, via the second current or voltage source, the second drive current or voltage to dynamically adjust an optical power of light emitted from the laser device to a target optical power at least on a per pixel basis for the plurality of pixels of the display. In this example and/or other examples, the controller may be configured to, based on the target optical power being greater than a threshold optical power, 1) modulate, via the first current or voltage source, the first drive current or voltage such that the gain section amplifies the optical power of light in the gain section at least to the target optical power and 2) modulate, via the second current or voltage source, the second drive current or voltage such that the modulator minimally or does not attenuate the optical power of light passing through the modulator. In this example and/or other examples, the controller may be configured to, based on the target optical power being less than the threshold optical power, 1) modulate, via the first current or voltage source, the first drive current or voltage such that the gain section amplifies the optical power of light in the gain section to a preliminary optical power that is greater than the target optical power, and 2) modulate, via the second current or voltage source, the second drive current or voltage such that the modulator attenuates or amplifies the preliminary optical power of light passing through the modulator to the target optical power. In this example and/or other examples, the gain section and the modulator may be fabricated as a same epitaxial layer on a monolithic substrate. In this example and/or other examples, the gain section and the modulator may be optically coupled via a bridging component. In this example and/or other examples, the bridging component may comprise a Bragg grating. In this example and/or other examples, the bridging component may comprise a notch. In this example and/or other examples, the gain section and the modulator may be optically coupled via heterogeneous integration. In this example and/or other examples, the display may comprise a micro electro-mechanical system (MEMS) laser scanning display.

In another example, a method for operating a laser device as a laser light source for a display including a plurality of pixels, the laser device including a gain section and a modulator, comprises determining a target optical power of light for a pixel of the display, and based on the target optical power being less than a threshold optical power, modulating, via a first current or voltage source electrically coupled to the gain section, a first drive current or voltage such that the gain section amplifies the optical power of light in the gain section to a preliminary optical power that is greater than the target optical power, and modulating, via a second current or voltage source electrically coupled to the modulator, a second drive current or voltage such that the modulator attenuates or amplifies the preliminary optical power of light passing through the modulator to the target optical power to thereby provide light at the target optical power to the pixel of the display. In this example and/or other examples, the method may further comprise based on the target optical power being greater than the threshold optical power, modulating, via the first current or voltage source, the first drive current or voltage such that the gain section amplifies the optical power of light in the gain section to the target optical power, and modulating, via the second current or voltage source, the second drive current or voltage such that the modulator minimally or does not attenuate the optical power of light passing through the modulator to thereby provide light at the target optical power to the pixel of the display. In this example and/or other examples, the target optical power may be determined at least on a per pixel basis for the plurality of pixels of the display, and the first and second drive current or voltages may be modulated to dynamically adjust the optical power of light emitted from the laser device to the target optical power at least on a per pixel basis for the plurality of pixels of the display.

In yet another example, a display device, comprises a display including a plurality of pixels, a laser light source including a gain section electrically coupled with a first current or voltage source and configured to selectively amplify an optical power of light reflecting within the gain section based on a first drive current or voltage supplied from the first current or voltage source to the gain section, a modulator optically coupled with the gain section and electrically coupled with a second current or voltage source, the modulator configured to selectively attenuate or amplify an optical power of light received from the gain section based on a second drive current or voltage supplied from the second current or voltage source to the modulator, wherein light emitted from the modulator is provided to the display, and a controller configured to modulate, via the first current or voltage source, the first drive current or voltage and modulate, via the second current or voltage source, the second drive current or voltage to dynamically adjust an optical power of light emitted from the laser light source to a target optical power at least on a per pixel basis for the plurality of pixels of the display. In this example and/or other examples, the controller may be configured to, based on the target optical power for a pixel being greater than a threshold optical power, 1) modulate, via the first current or voltage source, the first drive current or voltage such that the gain section amplifies the optical power of light in the gain section at least to the target optical power and 2) modulate, via the second current or voltage source, the second drive current or voltage such that the modulator minimally or does not attenuate the optical power of light passing through the modulator. In this example and/or other examples, the controller may be configured to, based on the target optical power being less than the threshold optical power, 1) modulate, via the first current or voltage source, the first drive current or voltage such that the gain section amplifies the optical power of light in the gain section to a preliminary optical power that is greater than the target optical power, and 2) modulate, via the second current or voltage source, the second drive current or voltage such that the modulator attenuates or amplifies the preliminary optical power of light passing through the modulator to the target optical power. In this example and/or other examples, the gain section and the modulator may be fabricated as a same epitaxial layer on a monolithic substrate. In this example and/or other examples, the gain section and the modulator may be optically coupled via a bridging component. In this example and/or other examples, the gain section and the modulator may be optically coupled via heterogeneous integration. In this example and/or other examples, the display may comprise a micro electro-mechanical system (MEMS) laser scanning display.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A laser device for use with a display including a plurality of pixels, the laser device comprising:
   a gain section electrically coupled with a first current or voltage source and configured to selectively amplify an optical power of light reflecting within the gain section based on a first drive current or voltage supplied from the first current or voltage source to the gain section; and
   a modulator optically coupled with the gain section and electrically coupled with a second current or voltage source, the modulator configured to selectively attenuate or amplify an optical power of light received from the gain section based on a second drive current or voltage supplied from the second current or voltage source to the modulator, wherein light emitted from the modulator is provided to the display; and
   a controller configured to modulate, via the first current or voltage source, the first drive current or voltage and to modulate, via the second current or voltage source, the second drive current or voltage to dynamically adjust an optical power of light emitted from the laser device to a target optical power at least on a per pixel basis for the plurality of pixels of the display based on a control scheme where:
   in a first operating region where the target optical power is greater than a first threshold optical power, the controller modulates the gain section with the first drive current or voltage such that the gain section amplifies the optical power of light in the gain section to the target optical power, and modulates the modulator with the second current or voltage such that the modulator minimally or does not attenuate the optical power of light passing through the modulator,
   in a second operating region where the target optical power is less than the first threshold optical power and greater than a second optical power threshold, the controller modulates the gain section with the first drive current or voltage such that the gain section amplifies the optical power of light in the gain section to a preliminary optical power that is greater than the target optical power, and modulates the modulator with the second drive current or voltage such that the modulator attenuates or amplifies the preliminary optical power of light passing through the modulator to the target optical power, and
   in a third operating region, where the target optical power is less than a second threshold optical power, the controller modulates the gain section with the first drive current or voltage such that the gain section amplifies the optical power of light in the gain section to the target optical power, and modulates the modulator with the second current or voltage such that the modulator minimally or does not attenuate the optical power of light passing through the modulator,
   wherein the first threshold optical power is greater than a third threshold optical power that corresponds to a threshold driving current at which optical power output by the gain section rises linearly relative to a laser injection current that is provided to the gain section, and wherein the second threshold optical power is less than the third threshold optical power.

2. The laser device of claim 1, wherein the gain section and the modulator are fabricated as a same epitaxial layer on a monolithic substrate.

3. The laser device of claim 1, wherein the gain section and the modulator are optically coupled via a bridging component.

4. The laser device of claim 3, wherein the bridging component comprises a Bragg grating.

5. The laser device of claim 3, wherein the bridging component comprises a notch.

6. The laser device of claim 1, wherein the gain section and the modulator are optically coupled via heterogeneous integration.

7. The laser device of claim 1, wherein the display comprises a micro electro-mechanical system (MEMS) laser scanning display.

8. A method for operating a laser device as a laser light source for a display including a plurality of pixels, the laser device including a gain section and a modulator, the method comprising:
   determining a target optical power of light for a pixel of the display; and
   based on the target optical power being less than a threshold optical power that is set based at least on an actual optical power corresponding to a laser injection current for the target optical power producing an error that is greater than a threshold error, wherein the error is a difference between the target optical power and the actual optical power due to a shift in a threshold current of the laser device above which optical power rises linearly relative to the laser injection current, and wherein the threshold error is set based at least on a perceivable variance in brightness of a pixel being illuminated by the laser device:
   modulating, via a first current or voltage source electrically coupled to the gain section, a first drive current or voltage such that the gain section amplifies the optical power of light in the gain section to a preliminary optical power that is greater than the target optical power; and
   modulating, via a second current or voltage source electrically coupled to the modulator, a second drive current or voltage such that the modulator attenuates or amplifies the preliminary optical power of light passing through the modulator to the target optical power to thereby provide light at the target optical power to the pixel of the display.

9. The method of claim 8, further comprising:
   based on the target optical power being greater than the threshold optical power,
   modulating, via the first current or voltage source, the first drive current or voltage such that the gain section amplifies the optical power of light in the gain section to the target optical power, and
   modulating, via the second current or voltage source, the second drive current or voltage such that the modulator minimally or does not attenuate the optical power of light passing through the modulator to thereby provide light at the target optical power to the pixel of the display.

10. The method of claim 8, wherein the target optical power is determined at least on a per pixel basis for the plurality of pixels of the display, and wherein the first and second drive current or voltages are modulated to dynamically adjust the optical power of light emitted from the laser device to the target optical power at least on a per pixel basis for the plurality of pixels of the display.

11. A display device, comprising:
a display including a plurality of pixels;
a laser light source including:
   a gain section electrically coupled with a first current or voltage source and configured to selectively amplify an optical power of light reflecting within the gain section based on a first drive current or voltage supplied from the first current or voltage source to the gain section;
   a modulator optically coupled with the gain section and electrically coupled with a second current or voltage source, the modulator configured to selectively attenuate or amplify an optical power of light received from the gain section based on a second drive current or voltage supplied from the second current or voltage source to the modulator, wherein light emitted from the modulator is provided to the display; and
a controller configured to modulate, via the first current or voltage source, the first drive current or voltage and modulate, via the second current or voltage source, the second drive current or voltage to dynamically adjust an optical power of light emitted from the laser light source to a target optical power at least on a per pixel basis for the plurality of pixels of the display based on a control scheme where:
   in a first operating region where the target optical power is greater than a first threshold optical power, the controller modulates the gain section with the first drive current or voltage such that the gain section amplifies the optical power of light in the gain section to the target optical power, and modulates the modulator with the second current or voltage such that the modulator minimally or does not attenuate the optical power of light passing through the modulator,
   in a second operating region where the target optical power is less than the first threshold optical power and greater than a second optical power threshold, the controller modulates the gain section with the first drive current or voltage such that the gain section amplifies the optical power of light in the gain section to a preliminary optical power that is greater than the target optical power, and modulates the modulator with the second drive current or voltage such that the modulator attenuates or amplifies the preliminary optical power of light passing through the modulator to the target optical power, and
   in a third operating region, where the target optical power is less than a second threshold optical power, the controller modulates the gain section with the first drive current or voltage such that the gain section amplifies the optical power of light in the gain section to the target optical power, and modulates the modulator with the second current or voltage such that the modulator minimally or does not attenuate the optical power of light passing through the modulator,
   wherein the first threshold optical power is greater than a third threshold optical power that corresponds to a threshold driving current at which optical power output by the gain section rises linearly relative to a laser injection current that is provided to the gain section, and wherein the second threshold optical power is less than the third threshold optical power.

12. The display device of claim 11, wherein the gain section and the modulator are fabricated as a same epitaxial layer on a monolithic substrate.

13. The display device of claim 11, wherein the gain section and the modulator are optically coupled via a bridging component.

14. The display device of claim 11, wherein the gain section and the modulator are optically coupled via heterogeneous integration.

15. The display device of claim 11, wherein the display comprises a micro electro-mechanical system (MEMS) laser scanning display.

* * * * *